(12) United States Patent
Xue et al.

(10) Patent No.: US 12,213,328 B2
(45) Date of Patent: Jan. 28, 2025

(54) SILICON/PEROVSKITE TANDEM SOLAR CELL AND PREPARATION METHOD THEREOF

(71) Applicant: TONGWEI SOLAR (CHENGDU) CO., LTD., Chengdu (CN)

(72) Inventors: Jianfeng Xue, Anhui (CN); Maoli Zhu, Anhui (CN); Yongjie Wang, Anhui (CN); Yi Yu, Anhui (CN); Shijie Su, Anhui (CN)

(73) Assignee: Tongwei Solar (Chengdu) Co., Ltd., Sichuan Province (CN)

( * ) Notice: Subject to any disclaimer, the term of this patent is extended or adjusted under 35 U.S.C. 154(b) by 0 days.

(21) Appl. No.: 18/003,545

(22) PCT Filed: Apr. 27, 2022

(86) PCT No.: PCT/CN2022/089632
§ 371 (c)(1),
(2) Date: Dec. 28, 2022

(87) PCT Pub. No.: WO2023/005304
PCT Pub. Date: Feb. 2, 2023

(65) Prior Publication Data
US 2024/0172459 A1    May 23, 2024

(30) Foreign Application Priority Data
Jul. 29, 2021 (CN) .......................... 202110864717.0

(51) Int. Cl.
*H01L 31/044* (2014.01)
*H01L 31/0264* (2006.01)
(Continued)

(52) U.S. Cl.
CPC ......... *H10K 30/57* (2023.02); *H01L 31/0264* (2013.01); *H10K 71/10* (2023.02); *H10K 85/50* (2023.02); H10K 2102/351 (2023.02)

(58) Field of Classification Search
CPC ...... H01L 31/00–078; Y02E 10/50–60; H10K 30/00–89
(Continued)

(56) References Cited

U.S. PATENT DOCUMENTS

2018/0374977 A1   12/2018   Geerligs et al.
2020/0058819 A1   2/2020    Kirner et al.
(Continued)

FOREIGN PATENT DOCUMENTS

CN    104485395 A    4/2015
CN    105655449 A    6/2016
(Continued)

OTHER PUBLICATIONS

Vaucher et al., Controlled Nucleation of Thin Microcrystalline Layers for the Recombination Junction in a-Si Stacked Cells, Solar Energy Materials and Solar Cells, 49, 1997, 27-33 (Year: 1997).*
(Continued)

*Primary Examiner* — Bach T Dinh (57) ABSTRACT

The present disclosure relates to a silicon/perovskite tandem solar cell and a preparation method thereof and belongs to the technical field of perovskite tandem cells. The silicon/perovskite tandem solar cell includes a silicon bottom cell and a perovskite top cell, in which a seed crystal silicon layer and a tunneling layer are sequentially arranged between a surface of the silicon bottom cell and a bottom surface of the perovskite top cell, the seed crystal silicon layer being adjacent to the silicon bottom cell, and the tunneling layer being adjacent to the perovskite top cell. Here, the seed crystal silicon layer is an amorphous silicon layer, and the
(Continued)

tunneling layer is a doped microcrystalline silicon oxide layer. The cell facilitates the tunneling between the silicon bottom cell and the perovskite top cell, thereby improving the open circuit voltage and the conversion efficiency of the cell.

14 Claims, 5 Drawing Sheets

(51) Int. Cl.
    *H10K 30/57*     (2023.01)
    *H10K 71/10*     (2023.01)
    *H10K 85/50*     (2023.01)
    *H10K 102/00*     (2023.01)

(58) Field of Classification Search
    USPC .................................................. 136/243–265
    See application file for complete search history.

(56) References Cited

U.S. PATENT DOCUMENTS

2020/0176618 A1    6/2020    Ahn et al.
2022/0416107 A1*   12/2022   Yu ....................... H01L 31/0725

FOREIGN PATENT DOCUMENTS

| | | |
|---|---|---|
| CN | 107146846 A | 9/2017 |
| CN | 107564989 A | 1/2018 |
| CN | 110350087 A | 10/2019 |
| CN | 111081878 A | 4/2020 |
| CN | 111244278 A | 6/2020 |
| CN | 111554764 A | 8/2020 |
| CN | 111710743 A | 9/2020 |
| CN | 111710746 A | 9/2020 |
| CN | 111816773 A | 10/2020 |
| CN | 112164729 A | 1/2021 |
| CN | 113594372 A | 11/2021 |
| JP | 2017168498 A | 9/2017 |
| WO | 2019039762 A1 | 2/2019 |
| WO | WO-2021127654 A1 * | 6/2021 ........... H01L 27/302 |

OTHER PUBLICATIONS

Australian Government IP Australia, Examination Report No. 1, Application No. 2022291601, mailed Nov. 30, 2023, 7 pages.
Australian Government IP Australia, Examination report No. 2, Application No. 2022291601, mailed May 15, 2024, 4 pages.
Aydin et al., "Interplay between temperature and bandgap energies on the outdoor performance of perovskite/silicon tandem solar cells" Nature Energy, vol. 5, No. 11, Sep. 14, 2020, DOI: 10.1038/S41560-020-00687-4, 11 pages.
European Patent Office, Communication pursuant to Article 94(3), Application No. 22808927.2, mailed Dec. 19, 2023, 10 pages.
European Patent Office, European Search Report, Application No. 22808927.2, mailed Dec. 4, 2023, 4 pages.
Li et al., "Perovskite Tandem Solar Cells: From Fundamentals to Commercial Deployment" Chemical Reviews, American Chemical Society, vol. 120, No. 18, Aug. 7, 2020, ISSN: 0009-2665, DOI: 10.1021/ACS.CHEMREV.9B00780, 116 pages.
Mailoa et al. "A 2-terminal perovskite/silicon multijunction solar cell enabled by a silicon tunnel junction" Applied Physics Letters, American Institute of Physics, vol. 106, No. 12, Mar. 23, 2015, ISSN: 0003-6951, DOI: 10.1063/1.4914179, & Mailoa Jonathan P et al: "Supplementary Online Material A 2-Terminal Perovskite/Silicon Multijunction Solar Cell Enabled by a Silicon Tunnel Junction", 5 pages.
Mazzarella et al., "Infrared Light Management Using a Nanocrystalline Silicon Oxide Interlayer in Monolithic Perovskite/Silicon Heterojunction Tandem Solar Cells with Efficiency above 25%" Advanced Energy Materials, vol. 9, No. 14, Apr. 20, 2019, ISSN: 1614-6832, DOI: 10.1002/aenm.201803241, 9 pages.
Sarker et al., "Preparation and characterization of n-type microcrystalline hydrogenated silicon oxide films" Journal of Physics D: Applied Physics vol. 35, No. 11, Jun. 7, 2002, ISSN: 0022-3727, DOI: 10.1088/0022-3727/35/11/317, 6 pages.
International Search Report, China Patent Office, Application No. PCT/CN2022/089632, mailed Jul. 18, 2022, 4 pages.
Written Opinion of the International Searching Authority, China Patent Office, Application No. PCT/CN2022/089632, mailed Jul. 15, 2022, 4 pages.
China State Intellectual Property Office, First Office Opinion Notice, Application No. 202110864717.0, mailed Jan. 23, 2024, 11 pages. English Translation 11 pages.
China State Intellectual Property Office, Second Examination Opinion Notice, Application No. 202110864717.0, mailed Jul. 31, 2024, 7 pages, English Translation 7 pages.

* cited by examiner

SILICON/PEROVSKITE TANDEM SOLAR CELL AND PREPARATION METHOD THEREOF

CROSS-REFERENCES TO RELATED APPLICATIONS

The present disclosure claims the priority to the Chinese patent application with the application number of "CN 202110864717.0", and entitled "Silicon/Perovskite Tandem Solar Cell and Preparation Method Thereof" filed to the Chinese Patent Office on Jul. 29, 2021, the entire content of which incorporated by reference in this disclosure.

TECHNICAL FIELD

The present disclosure relates to the technical field of perovskite tandem cells, and in particular to a silicon/perovskite tandem solar cell and a preparation method thereof.

BACKGROUND ART

Perovskite tandem cells belong to the third-generation photovoltaic technology. As a novel semiconductor material that has attracted the most attention in recent years, perovskite tandem cells have broad application prospects in many fields such as photovoltaics, detection, display, and lighting. However, perovskite tandem cells in the prior art often have problems of low open circuit voltage and low conversion efficiency after prepared.

SUMMARY

The present disclosure provides a silicon/perovskite tandem solar cell, including a silicon bottom cell and a perovskite top cell, wherein a seed crystal silicon layer and a tunneling layer are sequentially arranged between a surface of the silicon bottom cell and a bottom surface of the perovskite top cell, the seed crystal silicon layer being adjacent to the silicon bottom cell, and the tunneling layer being adjacent to the perovskite top cell; and
wherein the seed crystal silicon layer is an amorphous silicon layer, and the tunneling layer is a doped microcrystalline silicon oxide layer, a doped carbonized microcrystalline silicon layer, or a doped carbonized microcrystalline silicon oxide layer.

In some embodiments, the amorphous silicon layer has a thickness of 1-3 nm; and the tunneling layer has a thickness of 10-30 nm.

In some embodiments, the silicon bottom cell includes an N-type doped amorphous silicon layer, a first intrinsic amorphous silicon layer, an N-type silicon wafer, a second intrinsic amorphous silicon layer, and a P-type doped amorphous silicon layer arranged in sequence from top to bottom; and the tunneling layer is a P-type doped microcrystalline silicon oxide layer, a P-type doped carbonized microcrystalline silicon layer, or a P-type doped carbonized microcrystalline silicon oxide layer.

In some embodiments, the silicon bottom cell includes a P-type doped amorphous silicon layer, a first intrinsic amorphous silicon layer, a P-type silicon wafer, a second intrinsic amorphous silicon layer, and an N-type doped amorphous silicon layer arranged in sequence from top to bottom; and the tunneling layer is an N-type doped microcrystalline silicon oxide layer, an N-type doped carbonized microcrystalline silicon layer, or an N-type doped carbonized microcrystalline silicon oxide layer.

The present disclosure also provides a preparation method of the silicon/perovskite tandem solar cell described above, including:
forming the silicon bottom cell;
depositing the amorphous silicon layer on an upper surface of the silicon bottom cell, and depositing the tunneling layer on a surface of the amorphous silicon layer, wherein the tunneling layer is a doped microcrystalline silicon oxide layer, a doped carbonized microcrystalline silicon layer, or a doped carbonized microcrystalline silicon oxide layer; and
forming the perovskite top cell on a surface of the tunneling layer.

In some embodiments, a deposition condition for the amorphous silicon layer includes: a flow rate of a gas source $SiH_4$ in a range of 200-1000 sccm; a gas pressure in a range of 0.3-1 mbar, and a radio frequency power in a range of 300-800 W.

In some embodiments, the tunneling layer is a P-type doped microcrystalline silicon oxide layer, and a deposition condition for the tunneling layer includes: a flow ratio of $H_2$, $SiH_4$, $CO_2$, and $B_2H_6$ of (200-500):(1-3):1:(1-3), a gas pressure in a range of 0.5-2 mbar, and a radio frequency power in a range of 1000-3000 W; or
the tunneling layer is a P-type doped carbonized microcrystalline silicon layer, and a deposition condition for the tunneling layer includes: a flow ratio of $H_2$, $SiH_4$, $CH_4$, and $B_2H_6$ of (200-500):(1-3):1:(1-3), a gas pressure in a range of 0.5-2 mbar, and a radio frequency power in a range of 1000-3000 W; or
the tunneling layer is a P-type doped carbonized microcrystalline silicon oxide layer, and a deposition condition for the tunneling layer includes: a flow ratio of $H_2$, $SiH_4$, $CO_2$, $CH_4$, and $B_2H_6$ of (200-500):(1-3):1:(1-3):(1-3), a gas pressure in a range of 0.5-2 mbar, and a radio frequency power in a range of 1000-3000 W.

In some embodiments, a method includes: texturing an N-type silicon wafer; depositing a first intrinsic amorphous silicon layer on a front surface of the N-type silicon wafer, and depositing a second intrinsic amorphous silicon layer on a back surface of the silicon wafer; and forming an N-type doped amorphous silicon layer on a surface of the first intrinsic amorphous silicon layer far away from the N-type silicon wafer, and forming a P-type doped amorphous silicon layer on a surface of the second intrinsic amorphous silicon layer far away from the N-type silicon wafer.

In some embodiments, the tunneling layer is an N-type doped microcrystalline silicon oxide layer, and a deposition condition for the tunneling layer includes: a flow ratio of $H_2$, $SiH_4$, $CO_2$, and $PH_3$ of (200-500):(1-3):1:(1-3), a gas pressure in a range of 0.5-2 mbar, and a radio frequency power in a range of 1000-3000 W; or the tunneling layer is an N-type doped carbonized microcrystalline silicon layer, and a deposition condition for the tunneling layer includes: a flow ratio of $H_2$, $SiH_4$, $CH_4$, and $PH_3$ of (200-500):(1-3):1:(1-3), a gas pressure in a range of 0.5-2 mbar, and a radio frequency power in a range of 1000-3000 W; or the tunneling layer is an N-type doped carbonized microcrystalline silicon oxide layer, and a deposition condition for the tunneling layer includes: a flow ratio of $H_2$, $SiH_4$, $CO_2$, $CH_4$, and $PH_3$ of (200-500):(1-3):1:(1-3):(1-3), a gas pressure in a range of 0.5-2 mbar, and a radio frequency power in a range of 1000-3000 W.

In some embodiments, a method of forming the silicon bottom cell includes: texturing a P-type silicon wafer;

depositing a first intrinsic amorphous silicon layer on a front surface of the P-type silicon wafer, and depositing a second intrinsic amorphous silicon layer on a back surface of the silicon wafer; and forming a P-type doped amorphous silicon layer on a surface of the first intrinsic amorphous silicon layer far away from the P-type silicon wafer, and forming an N-type doped amorphous silicon layer on a surface of the second intrinsic amorphous silicon layer far away from the P-type silicon wafer.

In some embodiments, a deposition condition for the first intrinsic amorphous silicon layer and the second intrinsic amorphous silicon layer respectively includes: a flow ratio of $H_2$ to $SiH_4$ of (1-15):1, a gas pressure in a range of 0.3-1 mbar, and a radio frequency power in a range of 300-1200 W.

In some embodiments, a deposition condition for the P-type doped amorphous silicon layer 216 includes: a flow ratio of $H_2$, $SiH_4$, and $B_2H_6$ of (5-10):1:(1-10), a gas pressure in a range of 0.5-2 mbar, and a radio frequency power in a range of 1000-3000 W.

In some embodiments, a deposition condition for the N-type doped amorphous silicon layer 212 includes: a flow ratio of $H_2$, $SiH_4$, and $PH_3$ of (5-10):1:(1-10), a gas pressure in a range of 0.5-2 mbar, and a radio frequency power in a range of 1000-3000 W.

BRIEF DESCRIPTION OF DRAWINGS

In order to clarify the technical solutions of the examples of the present disclosure clearer, the accompanying drawings required to be used in the examples will be briefly introduced below. It should be understood that the following drawings only show some examples of the present disclosure, and therefore should not be construed as a limitation of the scope. Those of ordinary skill in the art can obtain other related drawings based on these drawings without creative work.

Reference signs: 116, 212—N-type doped amorphous silicon layer; 115, 215 first intrinsic amorphous silicon layer; 114—N-type silicon wafer; 113, 213—second intrinsic amorphous silicon layer, 112, 216—P-type doped amorphous silicon layer; 111, 211—ITO conductive film layer; 134—transparent conductive oxide layer; 133—electron transport layer; 132—perovskite layer; 131—hole transport layer; 121, 221—seed crystal silicon layer; 122—P-type doped microcrystalline silicon oxide layer; 214—P-type silicon wafer; 222—N-type doped microcrystalline silicon oxide layer; 311—silicon oxide layer; and 312—aluminum oxide-silicon nitride layer.

DETAILED DESCRIPTION OF EMBODIMENTS

In order to make the objects, technical solutions, and advantages of the examples of the present disclosure clearer, the technical solutions of the present disclosure are clearly and completely described below.

The general method of preparing a perovskite tandem cell includes: forming a P-type doped amorphous silicon layer on a back surface of an N-type silicon wafer, forming a silicon dioxide layer and an N-type doped amorphous silicon layer sequentially on a front surface of an N-type silicon wafer, then forming a perovskite cell on the N-type doped amorphous silicon layer as an illuminated face, with a hole transport layer of the perovskite cell being in contact with the N-type doped amorphous silicon layer, to obtain a perovskite tandem cell. After the perovskite tandem cell is prepared, its open circuit voltage and conversion efficiency are not high.

The applicant has studied and found that in the existing perovskite tandem cells, the N-type doped amorphous silicon layer has excessively high crystallinity and the hole transport layer is made of a P-type amorphous organic material, and therefore, the lattice mismatch between the N-type doped amorphous silicon layer and the hole transport layer after stacked leads to the problem of difficult tunneling, resulting in low open circuit voltage and low conversion efficiency of the perovskite tandem cells.

To address the shortcomings in the prior art, in some embodiments, the present disclosure provides a silicon/perovskite tandem solar cell and a preparation method thereof, which can improve the open circuit voltage and conversion efficiency of the cell.

In some embodiments, the present disclosure provides two silicon/perovskite tandem solar cells.

Figure 1:
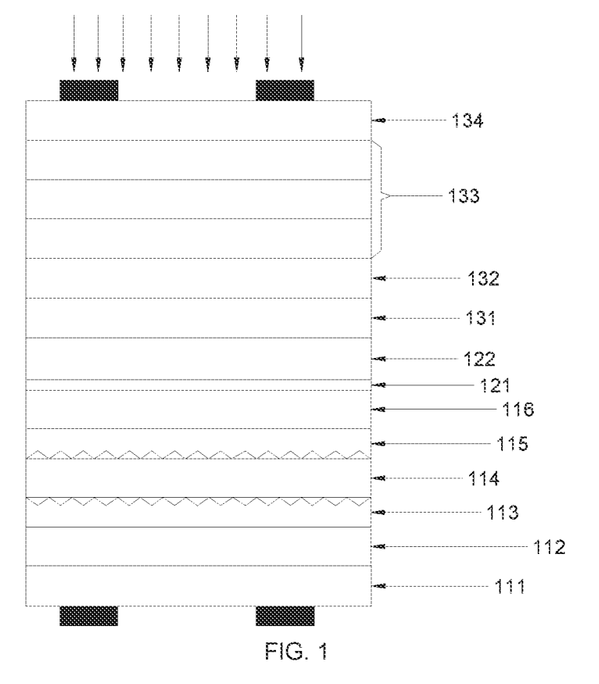
FIG. 1 is a first structural schematic view of a silicon/perovskite tandem solar cell provided in an example of the present disclosure.

In some embodiments, the present disclosure provides a silicon/perovskite tandem solar cell, of which a silicon bottom cell is a silicon cell formed on an N-type silicon wafer. The schematic structural diagram of the solar cell is shown in FIG. 1.

The silicon cell includes an N-type doped amorphous silicon layer 116, a first intrinsic amorphous silicon layer 115, an N-type silicon wafer 114, a second intrinsic amorphous silicon layer 113, a P-type doped amorphous silicon layer 112, an ITO conductive film layer 111, and a silver electrode in ohmic contact with the ITO conductive film layer 111, which are arranged in sequence from top to bottom.

The perovskite top cell includes a transparent conductive oxide layer 134, an electron transport layer 133, a perovskite layer 132, and a hole transport layer 131 arranged in sequence from top to bottom. Here, the transparent conductive oxide layer 134 may be an IZO transparent conductive thin film layer, and a silver electrode in ohmic contact therewith is provided on an upper surface of the IZO transparent conductive thin film layer. The electron transport layer 133 may include a $SnO_2$ layer, a C60 layer, and a LiF layer that are stacked from top to bottom. The material of the hole transport layer 131 is Spiro-TTB or PTAA.

If the perovskite top cell is directly stacked on the silicon bottom cell, the N-type doped amorphous silicon layer is in direct contact with the hole transport layer. Since the N-type doped amorphous silicon layer has excessively high crystallinity and the hole transport layer is made of a P-type amorphous organic material, the lattice mismatch between the N-type doped amorphous silicon layer and the hole transport layer that are directly stacked leads to the problem of difficult tunneling, resulting in lower open circuit voltage and conversion efficiency of perovskite tandem cells.

In order to solve the above problems, in the present disclosure, a seed crystal silicon layer 121 and a tunneling layer are sequentially arranged between a surface of the silicon bottom cell and a bottom surface of the perovskite top cell, the seed crystal silicon layer is adjacent to the silicon bottom cell, and the tunneling layer is adjacent to the perovskite top cell. Here, the seed crystal silicon layer 121 is an amorphous silicon layer, and the tunneling layer is a P-type doped microcrystalline silicon oxide layer 122, a P-type doped carbonized microcrystalline silicon layer, or a P-type doped carbonized microcrystalline silicon oxide layer (an example in which the tunneling layer is a P-type doped microcrystalline silicon oxide layer 122 is illustrated in FIG. 1).

In other words, the seed crystal silicon layer 121 (amorphous silicon layer) and the tunneling layer (P-type doped microcrystalline silicon oxide layer 122, P-type doped carbonized microcrystalline silicon layer, or P-type doped carbonized microcrystalline silicon oxide layer) are sequentially arranged on the N-type doped amorphous silicon layer 116 of the silicon bottom cell, and then the hole transport layer 131 of the perovskite top cell is stacked on the tunneling layer. On the one hand, the seed crystal silicon layer 121 can, as a seed crystal silicon layer, induce the growth of a nucleation layer, so as to subsequently grow a large-grain microcrystalline silicon oxide layer, carbonized microcrystalline silicon layer, or carbonized microcrystalline silicon oxide layer. Moreover, this layer has high crystallinity and can accommodate more doping elements to increase the doping concentration. On the other hand, compared to the N-type doped polycrystalline layer 116, the P-type doped microcrystalline silicon oxide layer 122, P-type doped carbonized microcrystalline silicon layer, or P-type doped carbonized microcrystalline silicon oxide layer has lower crystallinity and a high density of defect states, thereby facilitating the movement of carriers, which can be used as a good tunneling material to facilitate the tunneling between the silicon bottom cell and the perovskite top cell, thereby improving the open circuit voltage and conversion efficiency of the cell. Optionally, the amorphous silicon layer has a thickness of 1-3 nm; and the P-type doped microcrystalline silicon oxide layer 122, P-type doped carbonized microcrystalline silicon layer, or P-type doped carbonized microcrystalline silicon oxide layer has a thickness of 10-30 nm. The very thin amorphous silicon layer basically does not affect the thickness of the perovskite tandem cell, and can form a favorable tunneling layer, so that the open circuit voltage and conversion efficiency of the cell are higher.

As an example, the thickness of the amorphous silicon layer is, for example, 1.1-2.9 nm, 1.2-2.8 nm, or 1.3-2.7 nm, such as 1 nm, 2 nm, or 3 nm. The thickness of the P-type doped microcrystalline silicon oxide layer 122 is, for example, 12-28 nm, 15-25 nm, or 18-22 nm, such as 10 nm, 15 nm, 20 nm, 25 nm, or 30 nm; the thickness of the P-type doped carbonized microcrystalline silicon layer is, for example, 12-28 nm, 15-25 nm, or 18-22 nm, such as 10 nm, 15 nm, 20 nm, 25 nm, or 30 nm; or the thickness of the P-type doped carbonized microcrystalline silicon oxide layer is, for example, 12-28 nm, 15-25 nm, or 18-22 nm, such as 10 nm, 15 nm, 20 nm, 25 nm, or 30 nm.

A preparation method of the silicon/perovskite tandem solar cell described above includes the following steps.

S110, forming the silicon bottom cell.

S111, texturing the N-type silicon wafer 114. Optionally, the N-type silicon wafer 114 with a size of 156.75 mm and a thickness of 180 μm is textured and cleaned.

S112, depositing the first intrinsic amorphous silicon layer 115 on a front surface of the N-type silicon wafer 114, and depositing the second intrinsic amorphous silicon layer 113 on a back surface of the N-type silicon wafer 114. Optionally, the first intrinsic amorphous silicon layer 115 and the second intrinsic amorphous silicon layer 113 are prepared by PECVD.

In some embodiments, a single-layer or tandem amorphous silicon films are deposited using $SiH_4$ diluted with $H_2$ or pure $SiH_4$. Here, the deposition conditions for the intrinsic amorphous silicon layers include: a flow ratio of $H_2$ to $SiH_4$ of (1-15):1, for example, (2-14):1, (3-12):1, or (5-10):1; a gas pressure in a range of 0.3-1 mbar, for example, 0.4-0.9 mbar, 0.5-0.8 mbar, or 0.6-0.7 mbar; and a radio frequency power in a range of 300-1200 W, for example, 400-1100 W, 500-1000 W, or 600-800 W. The first intrinsic amorphous silicon layer 115 and the second intrinsic amorphous silicon layer 113 each having a thickness of 3-10 nm are thus obtained.

S113, forming, on a surface of the first intrinsic amorphous silicon layer 115 far away from the N-type silicon wafer 114, with the N-type doped amorphous silicon layer 116 being as an illuminated face. Optionally, the N-type doped amorphous silicon layer 116 is deposited on a surface of the first intrinsic amorphous silicon layer 115 far away from the N-type silicon wafer 114.

The deposition conditions for the N-type doped amorphous silicon layer 116 include: a flow ratio of $H_2$, $SiH_4$, and $PH_3$ of (5-10):1:(1-10), for example, (6-9):1:(2-8), (7-8):1:(3-7), or (7-8):1:(4-6); a gas pressure in a range of 0.5-2 mbar, for example, 0.6-1.9 mbar, 0.7-1.8 mbar, or 0.8-1.5 mbar; and a radio frequency power in a range of 1000-3000 W, for example, 1200-2800 W, 1500-2500 W, or 1800-2200 W. The N-type doped amorphous silicon layer 116 with a thickness of 10-30 nm is thus obtained.

S114, forming the P-type doped amorphous silicon layer 112 on a surface of the second intrinsic amorphous silicon layer 113 far away from the N-type silicon wafer 114. Optionally, the P-type doped amorphous silicon layer 112 is deposited on a surface of the second intrinsic amorphous silicon layer 113 far away from the N-type silicon wafer 114.

The deposition conditions for the P-type doped amorphous silicon layer 112 include: a flow ratio of $H_2$, $SiH_4$, and $B_2H_6$ of (5-10):1:(1-10), for example, (6-9):1:(2-8), (7-8):1:(3-7), or (7-8):1:(4-6); a gas pressure in a range of 0.5-2 mbar, for example, 0.6-1.9 mbar, 0.7-1.8 mbar, or 0.8-1.5 mbar; and a radio frequency power in a range of 1000-3000 W, for example, 1200-2800 W, 1500-2500 W, or 1800-2200 W. The P-type doped amorphous silicon layer 112 with a thickness of 10-30 nm is thus obtained.

S115, depositing the ITO conductive film layer 111 with a thickness of 80-100 nm by a RPD or PVD method on a back surface of the P-type doped amorphous silicon layer 112.

S116, forming, as a backplate, Ag electrode by screen printing, and solidifying it to form a good ohmic contact between silver grid lines and the ITO conductive film layer 111. An HJT bottom cell is thus fabricated.

Here, the above-mentioned steps S115 and S116 may be performed in the described order, or may be performed after step S120, which is not limited in the present disclosure.

S120, depositing the seed crystal silicon layer 121 on an upper surface of the silicon bottom cell, and depositing the tunneling layer on a surface of the seed crystal silicon layer 121, in which the tunneling layer is the P-type doped microcrystalline silicon oxide layer 122, P-type doped carbonized microcrystalline silicon layer, or P-type doped carbonized microcrystalline silicon oxide layer. Optionally, an amorphous silicon layer is deposited on a surface of the N-type doped amorphous silicon layer 116, and the tunneling layer is deposited on a surface of the amorphous silicon layer.

Optionally, the deposition conditions for the amorphous silicon layer include: a flow rate of gas source $SiH_4$ in a range of 200-1000 sccm, for example, 300-900 sccm, 400-800 sccm, or 500-700 sccm, such as 200 sccm, 400 sccm, 500 sccm, 600 sccm, 800 sccm, or 1000 sccm; a gas pressure in a range of 0.3-1 mbar, for example, 0.4-0.9 mbar, 0.5-0.8 mbar, or 0.6-0.7 mbar, such as 0.3 mbar, 0.4 mbar, 0.5 mbar, 0.6 mbar, 0.7 mbar, 0.8 mbar, 0.9 mbar, or 1 mbar; and a radio frequency power in a range of 300-800 W, for example, 400-700 W, 450-650 W or 500-600 W, such as 300 W, 400 W, 500 W, 600 W, 700 W, or 800 W. The amorphous silicon layer with a thickness of 1-3 nm is thus obtained.

In some embodiments, the tunneling layer is the P-type doped microcrystalline silicon oxide layer 122, and the deposition conditions therefor include: a flow ratio of $H_2$, $SiH_4$, $CO_2$, and $B_2H_6$ of (200-500):(1-3):1:(1-3), for example, (250-450):(1.2-2.8):1:(1.2-2.8), (280-420):(1.3-2.7):1:(1.3-2.7), or (320-380):(1.4-2.6):1:(1.4-2.6); a gas pressure in a range of 0.5-2 mbar, for example, 0.8-1.8 mbar, 1.0-1.6 mbar, or 1.2-1.4 mbar, such as 0.5 mbar, 1.0 mbar, 1.5 mbar, or 1.9 mbar; and a radio frequency power in a range of 1000-3000 W, for example, 1200-2800 W, 1500-2500 W, or 1800-2200 W, such as 1100 W, 1300 W, 1500 W, 1700 W, 1900 W, 2100 W, 2300 W, 2500 W, 2700 W, or 2900 W. The P-type doped microcrystalline silicon oxide layer 122 with a thickness of 10-30 nm is thus obtained.

In some embodiments, the tunneling layer is the P-type doped carbonized microcrystalline silicon layer, and the deposition conditions therefor include: a flow ratio of $H_2$, $SiH_4$, $CH_4$, and $B_2H_6$ of (200-500):(1-3):1:(1-3), for example, (250-450):(1.2-2.8):1:(1.2-2.8), (280-420):(1.3-2.7):1:(1.3-2.7) or (320-380):(1.4-2.6):1:(1.4-2.6); a gas pressure in a range of 0.5-2 mbar, for example, 0.7-1.9 mbar, 1.0-1.6 mbar, or 1.2-1.4 mbar, such as 0.5 mbar, 1.0 mbar, 1.5 mbar, or 1.9 mbar; and a radio frequency power in a range of 1000-3000 W, for example, 1200-2800 W, 1500-2500 W, or 1800-2200 W, such as 1100 W, 1300 W, 1500 W, 1700 W, 1900 W, 2100 W, 2300 W, 2500 W, 2700 W, or 2900 W. In other embodiments, the carbon source is not limited to methane, but may also be ethane or propane.

In some embodiments, the tunneling layer is the P-type doped carbonized microcrystalline silicon oxide layer, and the deposition conditions therefor include: a flow ratio of $H_2$, $SiH_4$, $CO_2$, $CH_4$, and $B_2H_6$ of (200-500):(1-3):1:(1-3):(1-3), for example, (250-450):(1.2-2.8):1:(1.2-2.8): (1.2-2.8), (280-420):(1.3-2.7):1:(1.3-2.7):(1.3-2.7), or (320-380):(1.4-2.6):1: (1.4-2.6):(1.4-2.6); a gas pressure in a range of 0.5-2 mbar, for example, 0.7-1.9 mbar, 1.0-1.6 mbar, or 1.2-1.4 mbar, such as 0.5 mbar, 1.0 mbar, 1.5 mbar, or 1.9 mbar; a radio frequency power in a range of 1000-3000 W, for example, 1200-2800 W, 1500-2500 W, or 1800-2200 W, such as 1100 W, 1300 W, 1500 W, 1700 W, 1900 W, 2100 W, 2300 W, 2500 W, 2700 W, or 2900 W. In other embodiments, the carbon source is not limited to methane, but may also be ethane or propane.

S130, forming the perovskite top cell on a surface of the tunneling layer.

Optionally, the hole transport layer 131, the perovskite layer 132, the electron transport layer 133, and the transparent conductive oxide layer 134 are sequentially deposited on the surface of the tunneling layer.

For example, a Spiro-TTB layer, Perovskite layer, a LiF layer, a C60 layer, a $SnO_2$ layer, a TCO layer, and a silver electrode are sequentially deposited on the surface of the tunneling layer.

Figure 2:
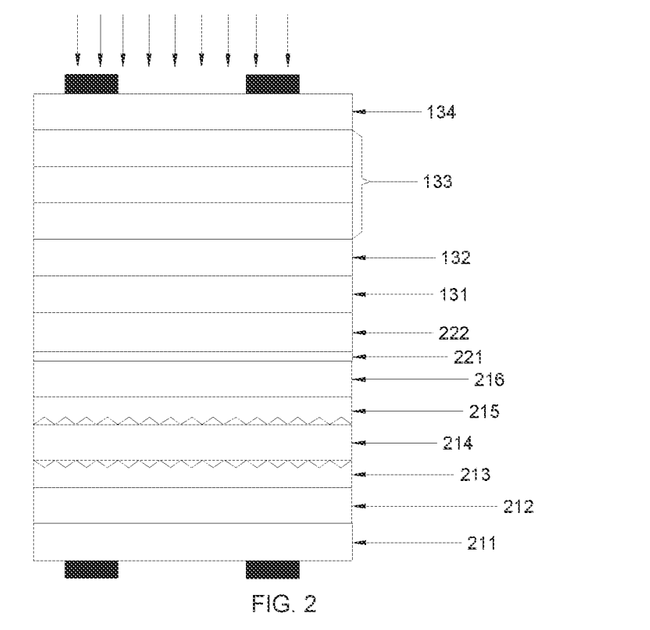
FIG. 2 is a second structural schematic view of a silicon/perovskite tandem solar cell provided in an example of the present disclosure.

In some embodiments, the present disclosure also provides another silicon/perovskite tandem solar cell, of which a silicon bottom cell is a silicon cell formed on a P-type silicon wafer 214. The schematic structural diagram of the solar cell is shown in FIG. 2.

The silicon cell includes a P-type doped amorphous silicon layer 216, a first intrinsic amorphous silicon layer 215, a P-type silicon wafer 214, a second intrinsic amorphous silicon layer 213, an N-type doped amorphous silicon layer 212, an ITO conductive film layer 211, and a silver electrode in ohmic contact with the ITO conductive film layer 211, which are arranged in sequence from top to bottom.

The structure of the perovskite top cell is the same as that of the perovskite top cell of the silicon bottom cell of the first kind of silicon/perovskite tandem solar cell, which will not be repeated here.

If the perovskite top cell is directly stacked on the silicon bottom cell, the P-type doped amorphous silicon layer is in direct contact with the electron transport layer. Since the P-type doped amorphous silicon layer has excessively high crystallinity and the electron transport layer is made of an N-type amorphous material, the lattice mismatch between the P-type doped amorphous silicon layer and the electron transport layer that are directly stacked leads to the problem of difficult tunneling, resulting in lower open circuit voltage and conversion efficiency of perovskite tandem cells.

In order to solve the above problems, in the present disclosure, a seed crystal silicon layer 221 and a tunneling layer are sequentially arranged between a surface of the silicon bottom cell and a bottom surface of the perovskite top cell, the seed crystal silicon layer is adjacent to the silicon bottom cell, and the tunneling layer is adjacent to the perovskite top cell. Here, the seed crystal silicon layer 221 is an amorphous silicon layer, and the tunneling layer is an N-type doped microcrystalline silicon oxide layer 222, an N-type doped carbonized microcrystalline silicon layer, or an N-type doped carbonized microcrystalline silicon oxide layer (an example in which the tunneling layer is an N-type doped microcrystalline silicon oxide layer 222 is illustrated in FIG. 2).

In other words, the seed crystal silicon layer 221 (amorphous silicon layer) and the tunneling layer (N-type doped microcrystalline silicon oxide layer 222, N-type doped carbonized microcrystalline silicon layer, or N-type doped carbonized microcrystalline silicon oxide layer) are sequentially arranged on the P-type doped amorphous silicon layer 216 of the silicon bottom cell, and then the hole transport layer 131 of the perovskite top cell is stacked on the tunneling layer. On the one hand, the seed crystal silicon layer 221 can, as a seed crystal silicon layer, induce the growth of a nucleation layer, so as to subsequently grow a large-grain microcrystalline silicon oxide layer, carbonized microcrystalline silicon layer, or carbonized microcrystalline silicon oxide layer. Moreover, this layer has high crystallinity and can accommodate more doping elements to increase the doping concentration. On the other hand, compared to the P-type doped polycrystalline layer 216, the N-type doped microcrystalline silicon oxide layer 222, N-type doped carbonized microcrystalline silicon layer, or N-type doped carbonized microcrystalline silicon oxide layer has low crystallinity and a high density of defect states, thereby facilitating the movement of carriers. They can be used as a good tunneling material to facilitate the tunneling between the silicon bottom cell and the perovskite top cell, thereby improving the open circuit voltage and conversion efficiency of the cell.

Optionally, the amorphous silicon layer has a thickness of 1-3 nm; and the N-type doped microcrystalline silicon oxide layer 222, N-type doped carbonized microcrystalline silicon layer, or N-type doped carbonized microcrystalline silicon oxide layer has a thickness of 10-30 nm. The very thin amorphous silicon layer basically does not affect the thickness of the perovskite tandem cell, and can form a favorable tunneling layer, so that the open circuit voltage and conversion efficiency of the cell are higher.

As an example, the thickness of the amorphous silicon layer is, for example, 1.1-2.9 nm, 1.2-2.8 nm, or 1.3-2.7 nm, such as 1 nm, 2 nm, or 3 nm. The thickness of the N-type doped microcrystalline silicon oxide layer 222 is, for example, 12-28 nm, 15-25 nm, or 18-22 nm, such as 10 nm, 15 nm, 20 nm, 25 nm, or 30 nm; the thickness of the N-type doped carbonized microcrystalline silicon layer is, for example, 12-28 nm, 15-25 nm, or 18-22 nm, such as 10 nm, 15 nm, 20 nm, 25 nm, or 30 nm, or the thickness of the N-type doped carbonized microcrystalline silicon oxide layer is, for example, 12-28 nm, 15-25 nm, or 18-22 nm, such as 10 nm, 15 nm, 20 nm, 25 nm, or 30 nm.

A preparation method of the silicon/perovskite tandem solar cell described above includes the following steps.

S210, forming the silicon bottom cell.

S211, texturing the P-type silicon wafer 214. Optionally, the P-type silicon wafer 214 with a size of 156.75 mm and a thickness of 180 μm is textured and cleaned.

S212, depositing the first intrinsic amorphous silicon layer 215 on a front surface of the P-type silicon wafer 214, and depositing the second intrinsic amorphous silicon layer 213 on a back surface of the P-type silicon wafer 214.

Optionally, the first intrinsic amorphous silicon layer 215 and the second intrinsic amorphous silicon layer 213 are prepared by PECVD.

In some embodiments, a single-layer or tandem amorphous silicon films are deposited using $SiH_4$ diluted with $H_2$ or pure $SiH_4$. Here, the deposition conditions for the intrinsic amorphous silicon layers include: a flow ratio of $H_2$ to $SiH_4$ of (1-15):1, for example, (2-14):1, (3-12):1, or (5-10):1; a gas pressure in a range of 0.3-1 mbar, for example, 0.4-0.9 mbar, 0.5-0.8 mbar, or 0.6-0.7 mbar; and a radio frequency power in a range of 300-1200 W, for example, 400-1100 W, 500-1000 W, or 600-800 W. The first intrinsic amorphous silicon layer 215 and the second intrinsic amorphous silicon layer 213 each having a thickness of 3-10 nm are thus obtained.

S213, forming, on a surface of the first intrinsic amorphous silicon layer 215 far away from the P-type silicon wafer 214, the P-type doped amorphous silicon layer 216 as an illuminated face. Optionally, the P-type doped amorphous silicon layer 216 is deposited on a surface of the first intrinsic amorphous silicon layer 215 far away from the P-type silicon wafer 214.

The deposition conditions for the P-type doped amorphous silicon layer 216 include: a flow ratio of $H_2$, $SiH_4$, and $B_2H_6$ of (5-10):1:(1-10), for example, (6-9):1:(2-8), (7-8):1:(3-7), or (7-8):1:(4-6); a gas pressure in a range of 0.5-2 mbar, for example, 0.6-1.9 mbar, 0.7-1.8 mbar, or 0.8-1.5 mbar; and a radio frequency power in a range of 1000-3000 W, for example, 1200-2800 W, 1500-2500 W, or 1800-2200 W. The P-type doped amorphous silicon layer 216 with a thickness of 10-30 nm is thus obtained.

S214, forming the N-type doped amorphous silicon layer 212 on a surface of the second intrinsic amorphous silicon layer 213 far away from the P-type silicon wafer 214. Optionally, the N-type doped amorphous silicon layer 212 is deposited on a surface of the second intrinsic amorphous silicon layer 213 far away from the P-type silicon wafer 214.

The deposition conditions for the N-type doped amorphous silicon layer 212 include: a flow ratio of $H_2$, $SiH_4$, and $PH_3$ of (5-10):1:(1-10), for example, (6-9):1:(2-8), (7-8):1:(3-7), or (7-8):1:(4-6); a gas pressure in a range of 0.5-2 mbar, for example, 0.6-1.9 mbar, 0.7-1.8 mbar, or 0.8-1.5 mbar; and a radio frequency power in a range of 1000-3000 W, for example, 1200-2800 W, 1500-2500 W, or 1800-2200 W. The N-type doped amorphous silicon layer 212 with a thickness of 10-30 nm is thus obtained.

S215, depositing the ITO conductive film layer 211 with a thickness of 80-100 nm by a RPD or PVD method on a back surface of the N-type doped amorphous silicon layer 212.

S216, forming, as a backplate, Ag electrode by screen printing, and solidifying it to form a good ohmic contact between silver grid lines and the ITO conductive film layer 211. An HJT bottom cell is thus fabricated.

Here, the above-mentioned steps S215 and S216 may be performed in the described order, or may be performed after step S220, which is not limited in the present disclosure.

S220, depositing the seed crystal silicon layer 221 on an upper surface of the silicon bottom cell, and depositing the tunneling layer on a surface of the seed crystal silicon layer 221, in which the tunneling layer is the N-type doped microcrystalline silicon oxide layer 222, N-type doped carbonized microcrystalline silicon layer, or N-type doped carbonized microcrystalline silicon oxide layer. Optionally, an amorphous silicon layer is deposited on a surface of the P-type doped amorphous silicon layer 216, and the tunneling layer is deposited on a surface of the amorphous silicon layer.

Optionally, the deposition conditions for the amorphous silicon layer include: a flow rate of gas source $SiH_4$ in a range of 200-1000 sccm, for example, 300-900 sccm, 400-800 sccm, or 500-700 sccm, such as 200 sccm, 400 sccm, 500 sccm, 600 sccm, 800 sccm, or 1000 sccm; a gas pressure in a range of 0.3-1 mbar, for example, 0.4-0.9 mbar, 0.5-0.8 mbar, or 0.6-0.7 mbar, such as 0.3 mbar, 0.4 mbar, 0.5 mbar, 0.6 mbar, 0.7 mbar, 0.8 mbar, 0.9 mbar, or 1 mbar; and a radio frequency power in a range of 300-800 W, for example, 400-700 W, 450-650 W, or 500-600 W, such as 300 W, 400 W, 500 W, 600 W, 700 W, or 800 W. The amorphous silicon layer with a thickness of 1-3 nm is thus obtained.

In some embodiments, the tunneling layer is the N-type doped microcrystalline silicon oxide layer 222, and the deposition conditions therefor include: a flow ratio of $H_2$, $SiH_4$, $CO_2$, and $PH_3$ of (200-500):(1-3):1:(1-3), for example, (250-450):(1.2-2.8):1:(1.2-2.8), (280-420):(1.3-2.7):1:(1.3-2.7), or (320-380):(1.4-2.6):1:(1.4-2.6); a gas pressure in a range of 0.5-2 mbar, for example, 0.8-1.8 mbar, 1.0-1.6 mbar, or 1.2-1.4 mbar, such as 0.5 mbar, 1.0 mbar, 1.5 mbar, or 1.9 mbar; and a radio frequency power in a range of 1000-3000 W, for example, 1200-2800 W, 1500-2500 W, or 1800-2200 W, such as 1100 W, 1300 W, 1500 W, 1700 W, 1900 W, 2100 W, 2300 W, 2500 W, 2700 W, or 2900 W. The N-type doped microcrystalline silicon oxide layer 222 with a thickness of 10-30 nm is thus obtained.

In some embodiments, the tunneling layer is an N-type doped carbonized microcrystalline silicon layer, and the deposition conditions therefor include: a flow ratio of $H_2$, $SiH_4$, $CH_2$, and $PH_3$ of (200-500):(1-3):1:(1-3), a gas pressure in a range of 0.5-2 mbar, and a radio frequency power in a range of 1000-3000 W; In other embodiments, the carbon source is not limited to methane, but may also be ethane or propane.

In some embodiments, the tunneling layer is the N-type doped carbonized microcrystalline silicon oxide layer, and the deposition conditions therefor include: a flow ratio of $H_2$, $SiH_4$, $CO_2$, $CH_4$, and $PH_3$ of (200-500):(1-3):1:(1-3):(1-3), for example, (250-450):(1.2-2.8):1:(1.2-2.8):(1.2-2.8), (280-420):(1.3-2.7):1:(1.3-2.7):(1.3-2.7), or (320-380):(1.4-2.6):1:(1.4-2.6):(1.4-2.6); a gas pressure in a range of 0.5-2 mbar, for example, 0.7-1.9 mbar, 1.0-1.6 mbar, or 1.2-1.4 mbar, such as 0.5 mbar, 1.0 mbar, 1.5 mbar, or 1.9 mbar; a radio frequency power in a range of 1000-3000 W, for example, 1200-2800 W, 1500-2500 W, or 1800-2200 W, such as 1100 W, 1300 W, 1500 W, 1700 W, 1900 W, 2100 W, 2300 W, 2500 W, 2700 W, or 2900 W. In other embodiments, the carbon source is not limited to methane, but may also be ethane or propane.

S230, forming the perovskite top cell on a surface of the tunneling layer.

Optionally, the hole transport layer 131, the perovskite layer 132, the electron transport layer 133, and the transparent conductive oxide layer 134 are sequentially deposited on the surface of the tunneling layer.

For example, a Spiro-TTB layer, Perovskite layer, a LiF layer, a C60 layer, a $SnO_2$ layer, a TCO layer, and a silver electrode are sequentially deposited on the surface of the tunneling layer.

In the present disclosure, the amorphous silicon layer can, as a seed crystal silicon layer, induce the growth of a nucleation layer, so as to subsequently grow a large-grain microcrystalline silicon oxide layer, carbonized microcrystalline silicon layer, or carbonized microcrystalline silicon oxide layer. Moreover, this layer has high crystallinity and can accommodate more doping elements to increase the doping concentration. In addition, compared to a doped polycrystalline layer, the doped microcrystalline silicon oxide layer, doped carbonized microcrystalline silicon layer, or doped carbonized microcrystalline silicon oxide layer has low crystallinity and a high density of defect states, facilitating the movement of carriers. They can be used as a good tunneling material to facilitate the tunneling between the silicon bottom cell and the perovskite top cell, thereby improving the open circuit voltage and conversion efficiency of the cell.

When the amorphous silicon layer is used as a seed layer of the P-type doped microcrystalline silicon oxide layer, P-type doped carbonized microcrystalline silicon layer, or P-type doped carbonized microcrystalline silicon oxide layer, in the formation process of the P-type doped microcrystalline silicon oxide layer, P-type doped carbonized microcrystalline silicon layer, or P-type doped carbonized microcrystalline silicon oxide layer, the amorphous silicon layer may first induce the growth of a nucleation layer, which then continues to deposit to allow the formation of a large-grain microcrystalline silicon layer. Moreover, the P-type doping concentration therein is relatively high, and thus a tunneling layer with a high density of defect states and multiple carrier recombination centers is formed, which facilitates the tunneling between the N-type silicon bottom cell and the perovskite top cell.

When the amorphous silicon layer is used as a seed layer of the N-type doped microcrystalline silicon oxide layer, N-type doped carbonized microcrystalline silicon layer, or N-type doped carbonized microcrystalline silicon oxide layer, in the formation process of the N-type doped microcrystalline silicon oxide layer, N-type doped carbonized microcrystalline silicon layer, or N-type doped carbonized microcrystalline silicon oxide layer, the amorphous silicon layer may first induce the growth of a nucleation layer, which then continues to deposit to allow the formation of a large-grain microcrystalline silicon layer. Moreover, the N-type doping concentration therein is relatively high, and thus a tunneling layer with a high density of defect states and multiple carrier recombination centers was formed, which facilitates the tunneling between the P-type silicon bottom cell and the perovskite top cell.

Furthermore, in the preparation method of the silicon/perovskite tandem solar cell of the present disclosure, the seed crystal silicon layer is first formed on the silicon bottom cell, and during the formation process of the tunneling layer, the seed crystal silicon layer may induce the growth of a nucleation layer, so as to subsequently grow a large-grain microcrystalline silicon oxide layer, carbonized microcrystalline silicon layer, or carbonized microcrystalline silicon oxide layer. Moreover, this layer has high crystallinity and can accommodate more doping elements to increase the doping concentration. In addition, compared to a doped polycrystalline layer, the doped microcrystalline silicon oxide layer, doped carbonized microcrystalline silicon layer, or doped carbonized microcrystalline silicon oxide layer has lower crystallinity and a high density of defect states, thereby facilitating the movement of carriers. They can be used as a good tunneling material to facilitate the tunneling between the silicon bottom cell and the perovskite top cell, thereby improving the open circuit voltage and conversion efficiency of the cell.

In order to make the objects, technical solutions, and advantages of the embodiments of the present disclosure clearer, the technical solutions of the examples of the present disclosure will be clearly and completely described below. Those without indication of the specific conditions in the examples are carried out according to the conventional conditions or the conditions recommendation by the manufacturer. The used reagents or instruments without indication of the manufacturer are all conventional products that can be purchased from the market.

Example 1

As shown in FIG. 1, a preparation method of the silicon/perovskite tandem solar cell provided by the present disclosure included the following steps.

(1) An N-type silicon wafer 114 with a size of 156.75 mm and a thickness of 180 μm was textured and cleaned.

(2) A first intrinsic amorphous silicon layer 115 was deposited on a front surface of the N-type silicon wafer 114, and a second intrinsic amorphous silicon layer 113 was deposited on a back surface of the silicon wafer. Here, the deposition conditions for the intrinsic amorphous silicon layers included: a flow ratio of $H_2$ to $SiH_4$ of 5:1, a gas pressure of 0.6 mbar, and a radio frequency power of 800 W. Thereby, the first intrinsic amorphous silicon layer 115 and the second intrinsic amorphous silicon layer 113 each having a thickness of 8 nm were obtained.

(3) The N-type doped amorphous silicon layer 116 was deposited on a surface of the first intrinsic amorphous silicon layer 115 far away from the N-type silicon wafer 114. The deposition conditions for the N-type doped amorphous silicon layer 116 included: a flow ratio of $H_2$, $SiH_4$, and $PH_3$ of 8:1:5, a gas pressure of 1 mbar, and a radio frequency power of 2000 W. Thereby, the N-type doped amorphous silicon layer 116 having a thickness of 20 nm was obtained.

(4) A P-type doped amorphous silicon layer 112 was deposited on a surface of the second intrinsic amorphous silicon layer 113 far away from the N-type silicon wafer 114. The deposition conditions for the P-type doped amorphous silicon layer 112 included: a flow ratio of $H_2$, $SiH_4$, and $B_2H_6$ of 8:1:5, a gas pressure of 1 mbar, and a radio frequency power of 12000 W. Thereby, the P-type doped amorphous silicon layer 112 having a thickness of 10-30 nm was obtained.

(5) A seed crystal silicon layer 121, which was an amorphous silicon layer, was deposited on a surface of the N-type doped amorphous silicon layer 116, and the deposition conditions therefor included: a flow rate of gas source $SiH_4$ of 800 sccm; a gas pressure of 0.7 mbar, and a radio frequency power of 500 W. Thereby, a thin film of the amorphous silicon layer having a thickness of 2 nm was obtained.

(6) A P-type doped microcrystalline silicon oxide layer 122 was deposited on a surface of the amorphous silicon layer. The deposition conditions for the P-type doped microcrystalline silicon oxide layer 122 included: a flow ratio of $H_2$, $SiH_4$, $CO_2$, and $B_2H_6$ of 400:2:1:2, a gas pressure of 1 mbar, and a radio frequency power of 2000 W. Thereby, the P-type doped microcrystalline silicon oxide layer 122 having a thickness of 20 nm was obtained.

(7) An ITO conductive film layer 111 with a thickness of 90 nm was deposited by a PVD method on a back surface of the P-type doped amorphous silicon layer 112.

(8) An Ag electrode was formed, as a backplate, by screen printing, and solidified to form a good ohmic contact between silver grid lines and the ITO conductive film layer 111. An HJT bottom cell was thus fabricated.

(9) A Spiro-TTB layer, a Perovskite layer, a LiF layer, a C60 layer, a $SnO_2$ layer, a TCO layer, and a silver electrode were sequentially deposited on the surface of the P-type doped microcrystalline silicon oxide layer 122.

Example 2

As shown in FIG. 2, a preparation method of the silicon/perovskite tandem solar cell provided by the present disclosure included the following steps.

(1) A P-type silicon wafer 214 with a size of 156.75 mm and a thickness of 180 μm was textured and cleaned.

(2) A first intrinsic amorphous silicon layer 215 was deposited on a front surface of the P-type silicon wafer 214, and a second intrinsic amorphous silicon layer 213 was deposited on a back surface of the P-type silicon wafer 214. Here, the deposition conditions for the intrinsic amorphous silicon layers included: a flow ratio of $H_2$ to $SiH_4$ of 5:1, a gas pressure of 0.6 mbar, and a radio frequency power of 800 W. Thereby, the first intrinsic amorphous silicon layer 215 and the second intrinsic amorphous silicon layer 213 each having a thickness of 8 nm were obtained.

(3) A P-type doped amorphous silicon layer 216 was deposited on a surface of the first intrinsic amorphous silicon layer 215 far away from the P-type silicon wafer 214. The deposition conditions for the P-type doped amorphous silicon layer 216 included: a flow ratio of $H_2$, $SiH_4$, and $B_2H_6$ of 8:1:5, a gas pressure of 1 mbar, and a radio frequency power of 2000 W. Thereby, the P-type doped amorphous silicon layer 216 having a thickness of 20 nm was obtained.

(4) An N-type doped amorphous silicon layer 212 was deposited on a surface of the second intrinsic amorphous silicon layer 213 far away from the P-type silicon wafer 214. The deposition conditions for the N-type doped amorphous silicon layer 212 included: a flow ratio of $H_2$, $SiH_4$, and $PH_3$ of 8:1:5, a gas pressure of 1 mbar, and a radio frequency power of 12000 W. Thereby, the N-type doped amorphous silicon layer 212 having a thickness of 10-30 nm was obtained.

(5) A seed crystal silicon layer 221, which was an amorphous silicon layer, was deposited on a surface of the P-type doped amorphous silicon layer 216, and the deposition conditions therefor included: a flow rate of gas source $SiH_4$ of 800 sccm; a gas pressure of 0.7 mbar, and a radio frequency power of 500 W. Thereby, a thin film of the amorphous silicon layer having a thickness of 2 nm was obtained.

(6) An N-type doped microcrystalline silicon oxide layer 222 was deposited on a surface of the seed crystal silicon layer 221. The deposition conditions for the N-type doped microcrystalline silicon oxide layer 222 included: a flow ratio of $H_2$, $SiH_4$, $CO_2$, and $PH_3$ of 400:2:1:2, a gas pressure of 1 mbar, and a radio frequency power of 2000 W. Thereby, the N-type doped microcrystalline silicon oxide layer 222 having a thickness of 20 nm was obtained.

(7) An ITO conductive film layer 211 with a thickness of 90 nm was deposited by a PVD method on a back surface of the N-type doped amorphous silicon layer 212.

(8) An Ag electrode was formed, as a backplate, by screen printing, and solidified to form a good ohmic contact between silver grid lines and the ITO conductive film layer 211. An HJT bottom cell was thus fabricated.

(9) A Spiro-TTB layer, a Perovskite layer, a LiF layer, a C60 layer, a $SnO_2$ layer, a TCO layer, and a silver electrode were sequentially deposited on a surface of the N-type doped microcrystalline silicon oxide layer 222.

Example 3

Example 3 is an example improved based on Example 1, and its difference from Example 1 lies in that in step (6), a P-type doped carbonized microcrystalline silicon layer was deposited on a surface of the amorphous silicon layer, and the deposition conditions for the P-type doped carbonized microcrystalline silicon layer included: a flow ratio of $H_2$, $SiH_4$, $CH_4$, and $B_2H_6$ of 400:2:1:2, a gas pressure of 1 mbar, and a radio frequency power of 2000 W. Thereby, the P-type doped carbonized microcrystalline silicon layer having a thickness of 20 nm was obtained.

Example 4

Example 4 is an example improved based on Example 1, and its difference from Example 1 lies in that in step (6), a P-type doped carbonized microcrystalline silicon oxide layer was deposited on a surface of the amorphous silicon layer, and the deposition conditions for the P-type doped carbonized microcrystalline silicon oxide layer included: a flow ratio of $H_2$, $SiH_4$, $CO_2$, $CH_4$, and $B_2H_6$ of 400:2:1:2:2, a gas pressure of 1 mbar, and a radio frequency power of 2000 W. Thereby, the P-type doped carbonized microcrystalline silicon oxide layer 122 having a thickness of 20 nm was obtained.

Comparative Example 1

Figure 3:
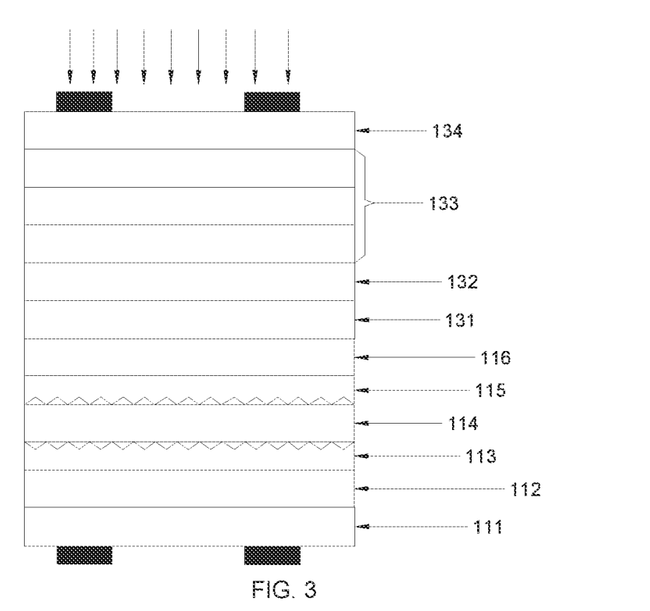
FIG. 3 is a structural schematic view of a silicon/perovskite tandem solar cell provided in Comparative Example 1.

FIG. 3 is a schematic view of a layer structure of a silicon/perovskite tandem solar cell provided in Comparative Example 1. As shown in FIG. 3, the difference between Comparative Example 1 and Example 1 lies in that in Comparative Example 1, step (5) and step (6) in Example 1 were not carried out.

Comparative Example 2

Figure 4:
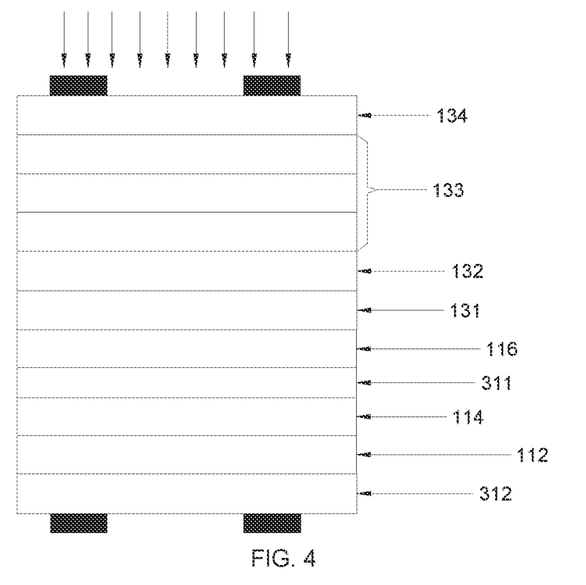
FIG. 4 is a structural schematic view of a silicon/perovskite tandem solar cell provided in Comparative Example 2.

FIG. 4 is a schematic view of a layer structure of a silicon/perovskite tandem solar cell provided in Comparative Example 2. As shown in FIG. 4, the difference between Comparative Example 2 and Example 1 lies in that in Comparative Example 2, step (5) and step (6) in Example 1 were not carried out. The layer structure of the silicon bottom cell included, from top to bottom, an N-type doped amorphous silicon layer 116, a silicon oxide layer 311, an N-type silicon wafer 114, a P-type doped amorphous silicon layer 112, an aluminum oxide-silicon nitride layer 312, and a silver electrode disposed thereon.

Comparative Example 3

Figure 5:
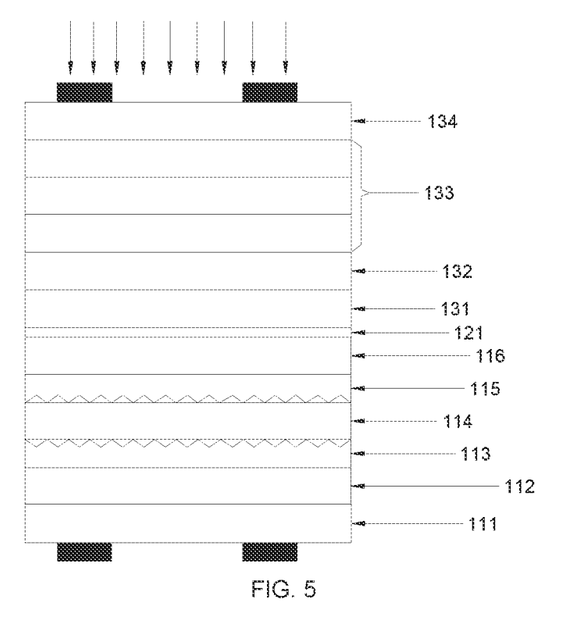
FIG. 5 is a structural schematic view of a silicon/perovskite tandem solar cell provided in Comparative Example 3.

FIG. 5 is a schematic view of a layer structure of a silicon/perovskite tandem solar cell provided in Comparative Example 3. As shown in FIG. 5, the difference between Comparative Example 3 and Example 1 lies in that in Comparative Example 3, step (5) in Example 1 was not carried out.

Comparative Example 4

Figure 6:
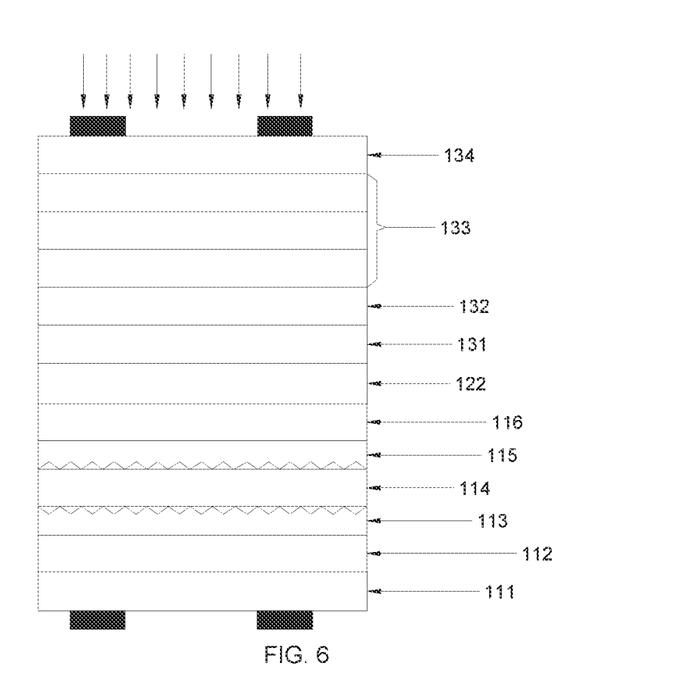
FIG. 6 is a structural schematic view of a silicon/perovskite tandem solar cell provided in Comparative Example 4.

FIG. 6 is a schematic view of a layer structure of a silicon/perovskite tandem solar cell provided in Comparative Example 4. As shown in FIG. 6, the difference between Comparative Example 4 and Example 1 lies in that in Comparative Example 4, step (6) in Example 1 was not carried out.

Comparative Example 5

The difference between Comparative Example 5 and Example 2 lies in that in Comparative Example 5, step (5) and step (6) in Example 2 were not carried out.

Test Example

Figure 7:
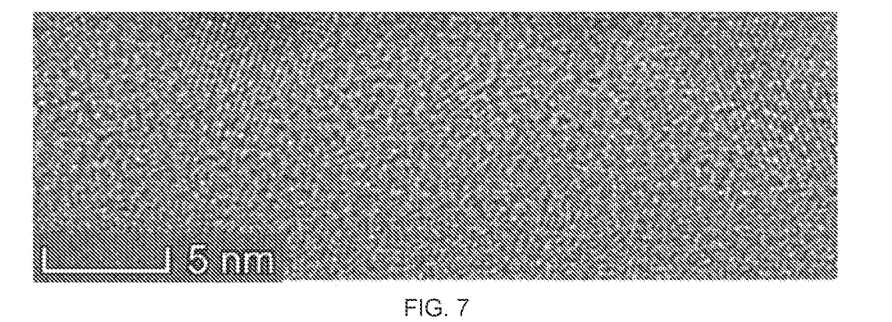
FIG. 7 is a TEM image after step (6) of the preparation method of the silicon/perovskite tandem solar cell provided in Example 1 of the present disclosure.

For the preparation method provided in Example 1, after step (6) was completed, the resultant was tested by TEM, and the test results are shown in FIG. 7. It can be seen from FIG. 7 that the lattice arrangement of the P-type doped microcrystalline silicon oxide layer was partly long-range ordered and partly disordered, the P-type doped microcrystalline silicon oxide layer and the N-type doped amorphous silicon layer under the amorphous silicon layer can form a PN junction, of which built-in electric field can promote hole tunneling. In addition, the PN junction can promote the Voc superposition of the bottom cell and the top cell, thereby increasing the open circuit voltage of the entire tandem cell and improving cell efficiency thereof.

Figure 8:
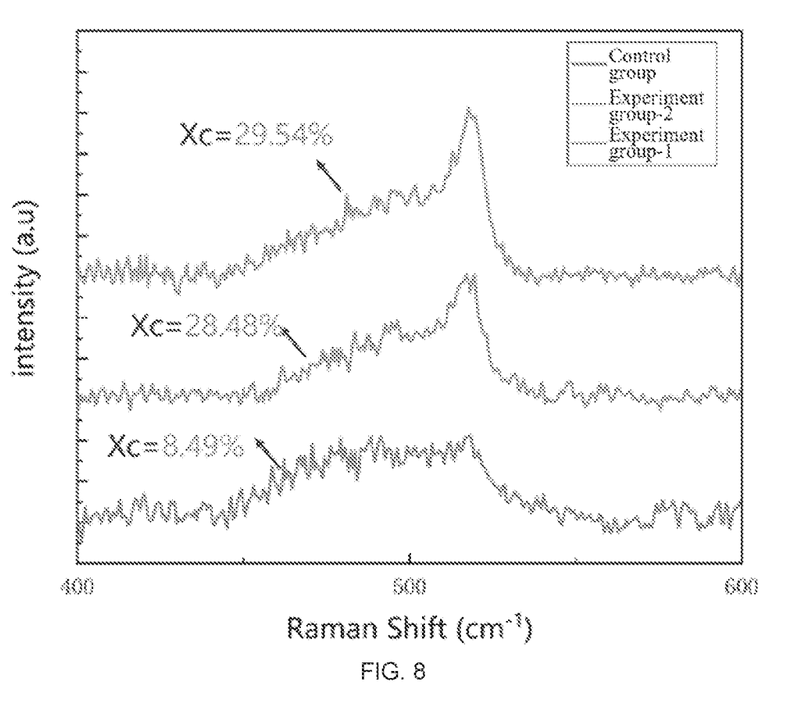
FIG. 8 is a diagram showing Raman spectra of the doped microcrystalline silicon oxide layers prepared by the respective preparation methods of the silicon/perovskite tandem solar cell provided in Example 1 and Example 2 of the present disclosure and Comparative Example 4.

FIG. 8 is a diagram showing Raman spectra of the doped microcrystalline silicon oxide layers prepared by the respective preparation methods of the silicon/perovskite tandem solar cells provided in Example 1 and Example 2 of the present disclosure and Comparative Example 4. In FIG. 8, the control group is a diagram of a Raman spectrum (Xc=8.49%) of the P-type doped microcrystalline silicon oxide layer provided in Comparative Example 4; the experimental group-1 is a diagram of a Raman spectrum (Xc=29.54%) of the P-type doped microcrystalline silicon oxide layer provided in Example 1; and the experimental group-2 is a diagram of a Raman spectrum (Xc=28.48%) of the N-type doped microcrystalline silicon oxide layer provided in Example 2. It can be seen from FIG. 8 that the seed crystal silicon layer (the amorphous silicon layer provided) can increase the crystallinity of the doped microcrystalline silicon oxide layer on the upper surface thereof.

The silicon/perovskite tandem solar cells provided in Examples 1 to 4 and Comparative Examples 1 to 5 were respectively tested for their performance, as shown in Table 1, according to the following detection method. Their electrical performance parameters such as the conversion efficiency (Eff), the open circuit voltage (Uoc), the short circuit current (Isc), and the fill factor (FF) of the silicon/perovskite tandem solar cells were tested at 25° C. under the conditions of AM 1.5 and 1 standard sunlight, using BERGER online I-V test system. The test results are shown in Table 1.

TABLE 1

Performance of silicon/perovskite tandem solar cells

| | Eff (conversion efficiency) | Uoc (open circuit voltage) | Isc (short circuit current) | FF (fill factor) |
|---|---|---|---|---|
| Example 1 | 105.16% | 243.09% | 47.30% | 91.46% |
| Example 2 | 94.90% | 224.25% | 47.10% | 89.85% |
| Example 3 | 105.80% | 245.18% | 46.50% | 92.80% |
| Example 4 | 110.64% | 246.33% | 48.35% | 92.90% |
| Comparative Example 1 | 100.00% | 100.00% | 100.00% | 100.00% |
| Comparative Example 2 | 85.22% | 205.52% | 47.55% | 87.20% |
| Comparative Example 3 | 47.65% | 130.78% | 47.28% | 77.06% |
| Comparative Example 4 | 101.20% | 238.15% | 47.10% | 90.23% |
| Comparative Example 5 | 43.80% | 80.23% | 90.33% | 60.45% |

It can be seen from Table 1 that in the silicon/perovskite tandem solar cells provided by the present disclosure, the amorphous silicon layer and the doped microcrystalline silicon oxide layer are sequentially arranged between the silicon bottom cell and the perovskite cell, which can improve the conversion efficiency and the open circuit voltage of the cell.

Comparing Example 1 with Comparative Examples 1 and 2, it can be seen that the amorphous silicon layer and the P-type doped microcrystalline silicon oxide layer sequentially arranged between the silicon bottom cell and the perovskite cell can improve the conversion efficiency and the open circuit voltage of the cell.

Comparing Example 1 with Comparative Examples 3 and 4, it can be seen that when only the P-type doped microcrystalline silicon oxide layer is arranged between the silicon bottom cell and the perovskite cell, the conversion efficiency of the cell is not increased significantly; when only the amorphous silicon layer is arranged between the silicon bottom cell and the perovskite cell, the conversion efficiency of the cell is reduced; and the amorphous silicon layer and the P-type doped microcrystalline silicon oxide layer have a certain synergistic effect when sequentially arranged between the silicon bottom cell and the perovskite cell, and thus can improve the conversion efficiency and the open circuit voltage of the cell.

Comparing Example 2 and Comparative Example 5, it can be seen that the amorphous silicon layer and the N-type doped microcrystalline silicon oxide layer sequentially arranged between the silicon bottom cell and the perovskite cell can improve the conversion efficiency and the open circuit voltage of the cell.

From Examples 1, 3, and 4, it can be seen that the P-type doped microcrystalline silicon oxide layer, the P-type doped carbonized microcrystalline silicon layer, and the P-type doped carbonized microcrystalline silicon oxide layer, when each combined with the amorphous silicon layer, can improve the conversion efficiency and the open circuit voltage of the cell.

The examples described above are some, but not all, of the examples of the present disclosure. The detailed description of the examples of the present disclosure is not intended to limit the claimed scope of the present disclosure but to represent only selected examples of the present disclosure. Based on the examples in the present disclosure, all other examples obtained by those of ordinary skill in the art without any creative work belong to the protection scope of the present disclosure.

INDUSTRIAL APPLICABILITY

The present disclosure provides a silicon/perovskite tandem solar cell and a preparation method thereof. The cell of the present disclosure in which the seed crystal silicon layer is an amorphous silicon layer, and the tunneling layer is a doped microcrystalline silicon oxide layer facilitates the tunneling between the silicon bottom cell and the perovskite top cell, thereby improving the open circuit voltage and conversion efficiency of the cell. The cell has excellent application performance and broad market prospects.

The invention claimed is:

1. A silicon/perovskite tandem solar cell, comprising a silicon bottom cell and a perovskite top cell, wherein a seed crystal silicon layer and a tunneling layer are sequentially arranged between a surface of the silicon bottom cell and a bottom surface of the perovskite top cell, wherein the seed crystal silicon layer is adjacent to the silicon bottom cell, and the tunneling layer is adjacent to the perovskite top cell; and
wherein the seed crystal silicon layer is an amorphous silicon layer, and the tunneling layer is a doped microcrystalline silicon oxide layer, a doped carbonized microcrystalline silicon layer, or a doped carbonized microcrystalline silicon oxide layer; and
wherein the silicon bottom cell comprises an N-type doped amorphous silicon layer, a first intrinsic amorphous silicon layer, an N-type silicon wafer, a second intrinsic amorphous silicon layer, and a P-type doped amorphous silicon layer arranged sequentially from top to bottom; and the tunneling layer is a P-type doped microcrystalline silicon oxide layer, a P-type doped carbonized microcrystalline silicon layer, or a P-type doped carbonized microcrystalline silicon oxide layer, or
the silicon bottom cell comprises a P-type doped amorphous silicon layer, a first intrinsic amorphous silicon layer, a P-type silicon wafer, a second intrinsic amorphous silicon layer, and an N-type doped amorphous silicon layer arranged sequentially from top to bottom; and the tunneling layer is an N-type doped microcrystalline silicon oxide layer, an N-type doped carbonized microcrystalline silicon layer, or an N-type doped carbonized microcrystalline silicon oxide layer.

2. The silicon/perovskite tandem solar cell according to claim 1, wherein the amorphous silicon layer has a thickness of 1-3 nm; and the tunneling layer has a thickness of 10-30 nm.

3. A preparation method of the silicon/perovskite tandem solar cell according to claim 1, comprising:
forming the silicon bottom cell;
depositing the amorphous silicon layer on an upper surface of the silicon bottom cell, and depositing the tunneling layer on a surface of the amorphous silicon layer, wherein the tunneling layer is the doped microcrystalline silicon oxide layer, the doped carbonized microcrystalline silicon layer, or the doped carbonized microcrystalline silicon oxide layer; and
forming the perovskite top cell on a surface of the tunneling layer.

4. The preparation method according to claim 3, wherein a deposition condition for the amorphous silicon layer comprises: a flow rate of a gas source $SiH_4$ in a range of 200-1000 sccm; a gas pressure in a range of 0.3-1 mbar, and a radio frequency power in a range of 300-800 W.

5. The preparation method according to claim 3, wherein the tunneling layer is a P-type doped microcrystalline silicon oxide layer, and a deposition condition for the tunneling layer comprises: a flow ratio of $H_2$, $SiH_4$, $CO_2$, and $B_2H_6$ of (200-500):(1-3): 1:(1-3), a gas pressure in a range of 0.5-2 mbar, and a radio frequency power in a range of 1000-3000 W; or
the tunneling layer is a P-type doped carbonized microcrystalline silicon layer, and a deposition condition for the tunneling layer comprises: a flow ratio of $H_2$, $SiH_4$, $CH_4$, and $B_2H_6$ of (200-500):(1-3): 1:(1-3), a gas pressure in a range of 0.5-2 mbar, and a radio frequency power in a range of 1000-3000 W; or
the tunneling layer is a P-type doped carbonized microcrystalline silicon oxide layer, and a deposition condition for the tunneling layer comprises: a flow ratio of $H_2$, $SiH_4$, $CO_2$, $CH_4$, and $B_2H_6$ of (200-500):(1-3):1: (1-3): (1-3), a gas pressure in a range of 0.5-2 mbar, and a radio frequency power in a range of 1000-3000 W.

6. The preparation method according to claim 5, wherein a method of forming the silicon bottom cell comprises: texturing an N-type silicon wafer; depositing a first intrinsic amorphous silicon layer on a front surface of the N-type silicon wafer, and depositing a second intrinsic amorphous silicon layer on a back surface of the silicon wafer; and forming an N-type doped amorphous silicon layer on a surface of the first intrinsic amorphous silicon layer far away from the N-type silicon wafer, and forming a P-type doped amorphous silicon layer on a surface of the second intrinsic amorphous silicon layer far away from the N-type silicon wafer.

7. The preparation method according to claim 3, wherein the tunneling layer is an N-type doped microcrystalline silicon oxide layer, and a deposition condition for the tunneling layer comprises: a flow ratio of $H_2$, $SiH_4$, $CO_2$, and $PH_3$ of (200-500):(1-3):1:(1-3), a gas pressure in a range of 0.5-2 mbar, and a radio frequency power in a range of 1000-3000 W; or
the tunneling layer is an N-type doped carbonized microcrystalline silicon layer, and a deposition condition for the tunneling layer comprises: a flow ratio of $H_2$, $SiH_4$, $CH_4$, and $PH_3$ of (200-500):(1-3):1:(1-3), a gas pressure in a range of 0.5-2 mbar, and a radio frequency power in a range of 1000-3000 W; or the tunneling layer is an N-type doped carbonized microcrystalline silicon oxide layer, and a deposition condition for the tunneling layer comprises: a flow ratio of $H_2$, $SiH_4$, $CO_2$, $CH_4$, and $PH_3$ of (200-500):(1-3):1:(1-3): (1-3), a gas pressure in a range of 0.5-2 mbar, and a radio frequency power in a range of 1000-3000 W.

8. The preparation method according to claim 7, wherein a method of forming the silicon bottom cell comprises: texturing a P-type silicon wafer; depositing a first intrinsic amorphous silicon layer on a front surface of the P-type silicon wafer, and depositing a second intrinsic amorphous silicon layer on a back surface of the silicon wafer; and forming a P-type doped amorphous silicon layer on a surface of the first intrinsic amorphous silicon layer far away from the P-type silicon wafer, and forming an N-type doped amorphous silicon layer on a surface of the second intrinsic amorphous silicon layer far away from the P-type silicon wafer.

9. The preparation method according to claim 6, wherein a deposition condition for the first intrinsic amorphous silicon layer and the second intrinsic amorphous silicon layer respectively comprises: a flow ratio of $H_2$ to $SiH_4$ of (1-15):1, a gas pressure in a range of 0.3-1 mbar, and a radio frequency power in a range of 300-1200 W.

10. The preparation method according to claim 6, wherein a deposition condition for the P-type doped amorphous silicon layer 216 comprises: a flow ratio of $H_2$, $SiH_4$, and $B_2H_6$ of (5-10):1:(1-10), a gas pressure in a range of 0.5-2 mbar, and a radio frequency power in a range of 1000-3000 W.

11. The preparation method according to claim 6, wherein a deposition condition for the N-type doped amorphous silicon layer 212 comprises: a flow ratio of $H_2$, $SiH_4$, and $PH_3$ of (5-10):1:(1-10), a gas pressure in a range of 0.5-2 mbar, and a radio frequency power in a range of 1000-3000 W.

12. The preparation method according to claim 8, wherein a deposition condition for the first intrinsic amorphous silicon layer and the second intrinsic amorphous silicon layer respectively comprises: a flow ratio of $H_2$ to $SiH_4$ of (1-15):1, a gas pressure in a range of 0.3-1 mbar, and a radio frequency power in a range of 300-1200 W.

13. The preparation method according to claim 8, wherein a deposition condition for the P-type doped amorphous silicon layer 216 comprises: a flow ratio of $H_2$, $SiH_4$, and $B_2H_6$ of (5-10):1:(1-10), a gas pressure in a range of 0.5-2 mbar, and a radio frequency power in a range of 1000-3000 W.

14. The preparation method according to claim 8, wherein a deposition condition for the N-type doped amorphous silicon layer 212 comprises: a flow ratio of $H_2$, $SiH_4$, and $PH_3$ of (5-10):1:(1-10), a gas pressure in a range of 0.5-2 mbar, and a radio frequency power in a range of 1000-3000 W.

* * * * *